(12) United States Patent
Bone (10) Patent No.: US 8,124,519 B2
(45) Date of Patent: Feb. 28, 2012

(54) APPARATUS AND METHOD FOR BONDING SILICON WAFER TO CONDUCTIVE SUBSTRATE

(75) Inventor: Gregory Alan Bone, Santa Monica, CA (US)

(73) Assignee: Energy Innovations, Inc., Poway, CA (US)

( * ) Notice: Subject to any disclaimer, the term of this patent is extended or adjusted under 35 U.S.C. 154(b) by 294 days.

(21) Appl. No.: 12/286,990

(22) Filed: Oct. 3, 2008

(65) Prior Publication Data

US 2009/0035894 A1 Feb. 5, 2009

Related U.S. Application Data

(63) Continuation of application No. 11/249,129, filed on Oct. 12, 2005, now Pat. No. 7,432,596.

(60) Provisional application No. 60/618,368, filed on Oct. 12, 2004.

(51) Int. Cl.
*H01L 21/44* (2006.01)

(52) U.S. Cl. ........ 438/612; 438/613; 438/614; 438/638; 257/E23.015

(58) Field of Classification Search .................. 257/673, 257/737, 780; 438/612, 613, 614, 638
See application file for complete search history.

(56) References Cited

U.S. PATENT DOCUMENTS

| 2001/0008310 A1* | 7/2001 | Sakuyama et al. ............ 257/737 |
| 2003/0137045 A1* | 7/2003 | Sugaya et al. ................. 257/701 |
| 2005/0236684 A1* | 10/2005 | Chen et al. .................... 257/433 |

* cited by examiner

*Primary Examiner* — Wai Sing Louie
(74) *Attorney, Agent, or Firm* — Andrew Naglestad (57) ABSTRACT

A system and method is disclosed for bonding a substrate to a semiconductor die that is prone to curling when subjected to an elevated temperature in a solder reflow oven, for example, thereby improving the electrical and mechanical bonding for large dies, wafers, chips, and photovoltaic cells. In one embodiment, the substrate is adapted to curl to the same degree as the die to form a uniform gap between the substrate and die across the boundary there between. In another embodiment, solder used to bond the die and substrate is applied such that the volume deposited varies based on the expected gap between the die and substrate when heated to the melting temperature of the solder.

4 Claims, 9 Drawing Sheets

(PRIOR ART)

FIG. 3

(PRIOR ART)

FIG. 4

(PRIOR ART)

APPARATUS AND METHOD FOR BONDING SILICON WAFER TO CONDUCTIVE SUBSTRATE

CROSS-REFERENCE TO RELATED APPLICATION

This application is a continuation of U.S. patent application Ser. No. 11/249,129 filed on Oct. 12, 2005, now U.S. Pat. No. 7,432,596 which claims priority of U.S. Provisional Patent Application Ser. No. 60/618,368, filed Oct. 12, 2004, both of which are hereby incorporated herein by reference in their entirety.

BACKGROUND

Solar cells, also known as photovoltaic cells, for converting light into electricity are becoming an increasingly viable source of power when compared to traditional petroleum based sources of energy. Solar cells come in many types including monocrystalline, polycrystalline, and thin-film. Some of the most efficient solar cells, e.g., monocrystalline cells, are thin slices called wafers that are cut from a single silicon crystal produced in the form of an ingot. The silicon may be doped with select impurities to form two separate semiconductor structures, i.e., n-type and p-type semiconductors, used to capture the energy of those photons absorbed by the wafer. A grid of metal may be applied to or otherwise incorporated in the wafer to provide electrical contacts. Groups of cells may then be mounted together and electrically coupled to form a solar panel.

Figure 1:
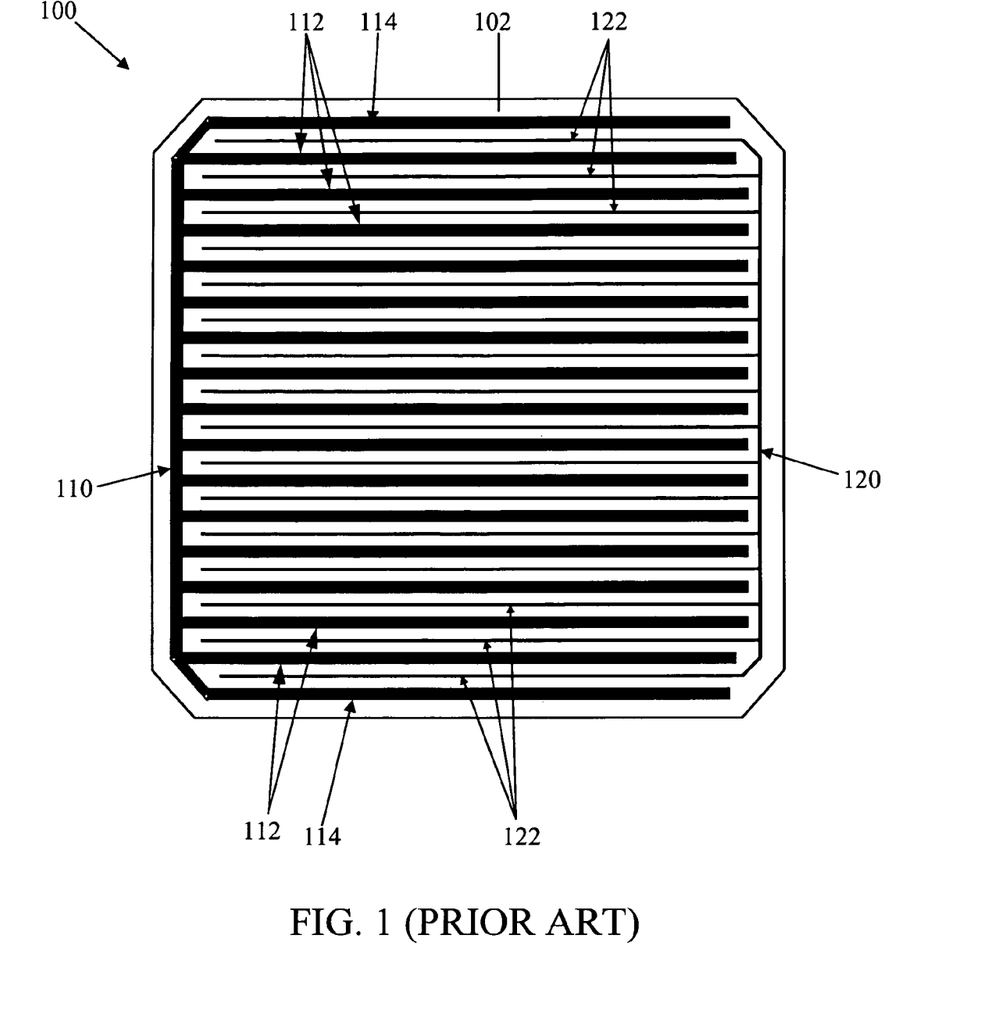
FIG. 1 is a plan view of a photovoltaic wafer including conductive traces according to the prior art.

Illustrated in FIG. 1 is a plan view of a photovoltaic silicon wafer 100 including a silicon portion 102 and two separate semiconductor members arranged to support an electric field between associated conductive elements and electrical contacts. The wafer 100 is adapted to directly transform sunlight into electrical energy using a p-n junction incorporated into the side of the wafer opposite the solar exposure. The p-n junction is comprised of p-type and n-type semiconductors applied to or incorporated into the wafer 100 by doping the wafer with boron and phosphorous atoms, respectively. The p-type semiconductor is coupled to and schematically represented by a first edge bar 110 and a first plurality of cross bars spanning the wafer 100 or a region thereof. The first plurality of cross bars includes one or more intermediate cross bars 112 and two cross bars 114 at the outer side edges of the wafer 100. The n-type semiconductor is coupled to and schematically represented by a second edge bar 120 and a second set of cross bars 122 that are parallel to and interdigitated with the first plurality of p-type cross bars 112, 114 to create a sequentially alternating pattern of p-type and n-type semiconductors and associated conductive elements. The first edge bar 110 serves to electrically couple the first plurality of cross bars, while the second edge bar 120 serves to electrically couple the second plurality of cross bars 122.

The side-edge cross bars 114 at the extreme edges of the wafer 100 are consistent with the intermediate cross bars 112. In particular, the width and thickness of the side-edge cross bars 114 is the same as that of the intermediate cross bars 112. The length of the side-edge cross bars 114 may be equal to or less than that of the intermediate cross bars 112 depending on whether the silicon wafer has been trimmed in the shape of a square or other polygon, for example. The gap between each of the p-type intermediate cross bars 112 and an adjacent n-type cross bar 122 is the same as the gap between each of side-edge cross bars 114 and an adjacent n-type cross bar.

Photons of sufficient energy incident on the wafer 100 generally generate electron-hole pairs. The ejected electrons are drawn to the p-type semiconductor and collected by the cross bars 112, 114, and the holes drawn to the n-type semiconductor and collected by the cross bars 122. Do to placement of an intermediate cross bar 112 between two adjacent n-type cross bars 122, the upper half of each intermediate cross bar 112 collects electrons from the region bounded by the first of the two adjacent n-type cross bars while the lower half of the of the intermediate cross bar collects holes from the region bounded by the second of the two adjacent n-type cross bars. Thus, the effective collection area of an intermediate cross bar 112 associated with a single p-type cross bar is defined by the region spanning the full length of the cross bar and the distance between two consecutive n-type cross bars 122. The wafer 100 may further include one or more conductive layers of metallization bonded to the p-type and n-type semiconductors to efficiently conduct the current collected by the wafer to electrical contacts coupled to other cells or an electrical load. The conductive layers, including copper and tin, are generally 60 milli-inches (mils) thick.

Figure 2:
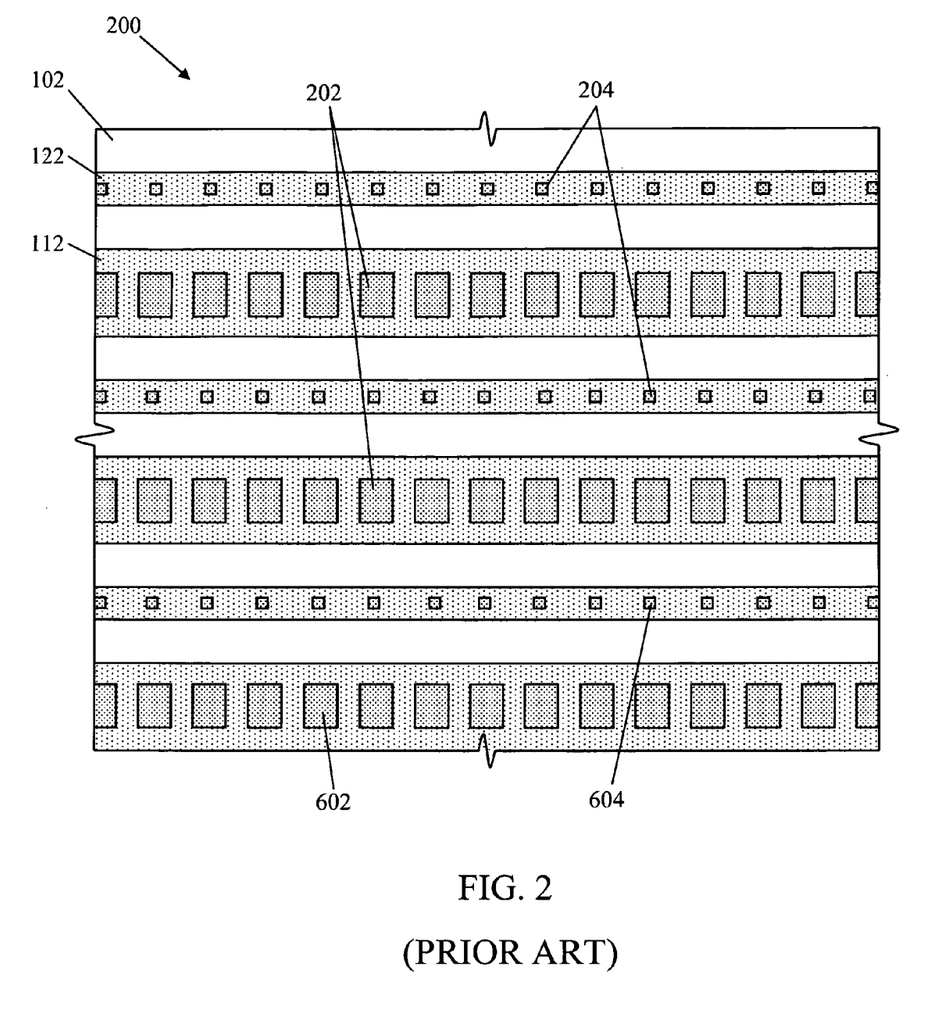
FIG. 2 is a plan view of the photovoltaic wafer and uniform pre-reflow solder paste for bonding the wafer to a complementary substrate, in accordance with the prior art.

While solar cells may be formed from substantially whole wafers, some solar panels employ a plurality of smaller silicon dies cut from a wafer to increase its packing density, The dies may then be bonded to a substrate providing structural support and thermal conductivity using solder that forms a bond when heated to its reflow temperature. Solder paste may be applied in select regions to the bonding surface and the combination of die and substrate subjected to a solder reflow oven. Illustrated in FIG. 2 is a plan view of a portion of a photovoltaic die 200 with a plurality of cross bars 112 associated with the p-type semiconductor, a plurality of cross bars associated 122 associated with the n-type conductor, and pre-reflow solder paste for bonding the die to a substrate applied to the cross bars. In this embodiment, the solder paste is applied to the die 200 using a stencil (not shown) having a pattern adapted to apply a plurality of beads of solder paste arrayed along the conductive surfaces of the die 200. Both the first set of solder beads 202 of equal size coinciding with the p-type semiconductor 112 and second set of solder beads 204 of equal size coinciding with the n-type semiconductor 122 are rectangular beads uniformly arrayed between the die 200 to the substrate. The solder paste is generally a bismuth-tin-silver mixture with a melting temperature of approximately 140 degrees Celsius and a reflow temperature of 160 degrees Celsius, although alternative solder pastes may also be used.

Figure 3:
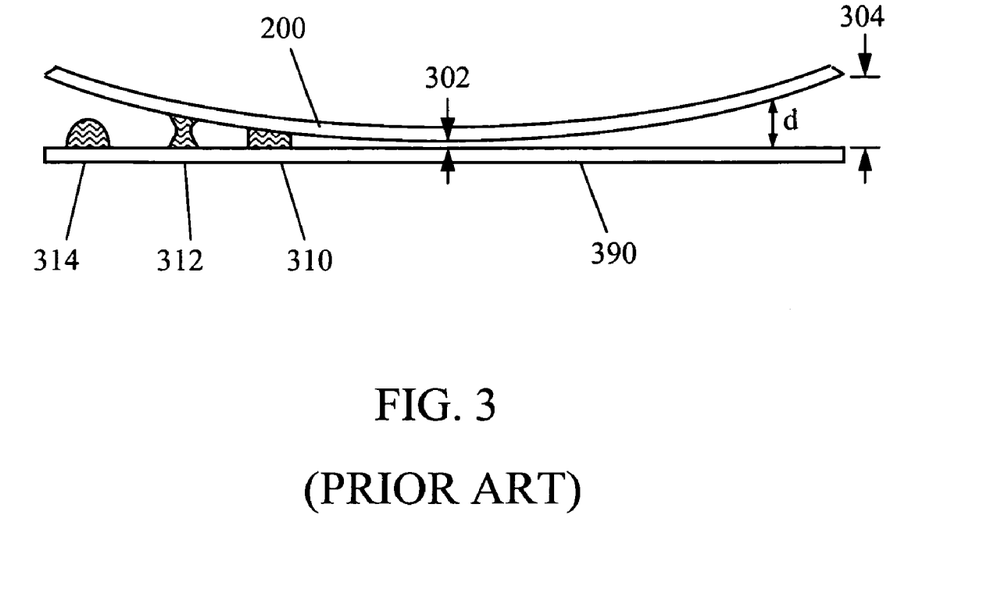
FIG. 3 is an edge-on view of the photovoltaic wafer and complementary substrate when subjected to elevated temperatures, in accordance with the prior art.

The maximum size of a die 200 that may be bonded to a substrate is, however, generally limited due to the deformation of the die when subject to heat. In particular, the heat of the reflow over induces greater curvature in the die 200 than the substrate, which causes the die to peal away from the substrate and form gaps between the die and substrate that degrade or inhibit proper solder bonding there between. Illustrated in FIG. 3 is an edge-on view of the photovoltaic die 200 and substrate 390 when subjected to elevated temperatures. The die 200, including layers of silicon and conductive traces (not shown), is predisposed to bend or curve in the solder reflow process do to the difference in the coefficient of thermal expansion (CTE) between the silicon and underlying conductive layers. As a result, the outer edges of the die 200 separate from and pull above the substrate 390. The distance, d, between the die 200 and substrate 390 generally varies depending on the distance from the center of the chip. The distance is generally smallest at the center of the die 200 and increases toward the periphery of the die where the separation distance 304 is maximal.

The quality of the electrical bonding between the die 200 and substrate 390 may vary significantly depending on the heat-induced curvature of the die 200. Ideally the solder beads should flow together to form a single continuous layer of solder bond. When subjected to the heat of the reflow over, solder beads 310 proximate to the center of the die generally maintain contact between the die 200 and substrate 390 when the solder melting point is reached, thus enabling the solder to effectively bond to both components. Solder beads 312 further away from the center of the die 200 maintain contact between the die 200 and substrate 390 after the solder melting point is reached, but may be unable to flow together with adjacent beads due to the lack of sufficient solder volume to fill the gap between components. Solder beads 314 still further out may fail to bond the die 200 and substrate 390 as a result of the die pulling away from the bead while the reflow oven temperature is above both the solder melting temperature and solidification temperature.

Figure 4:
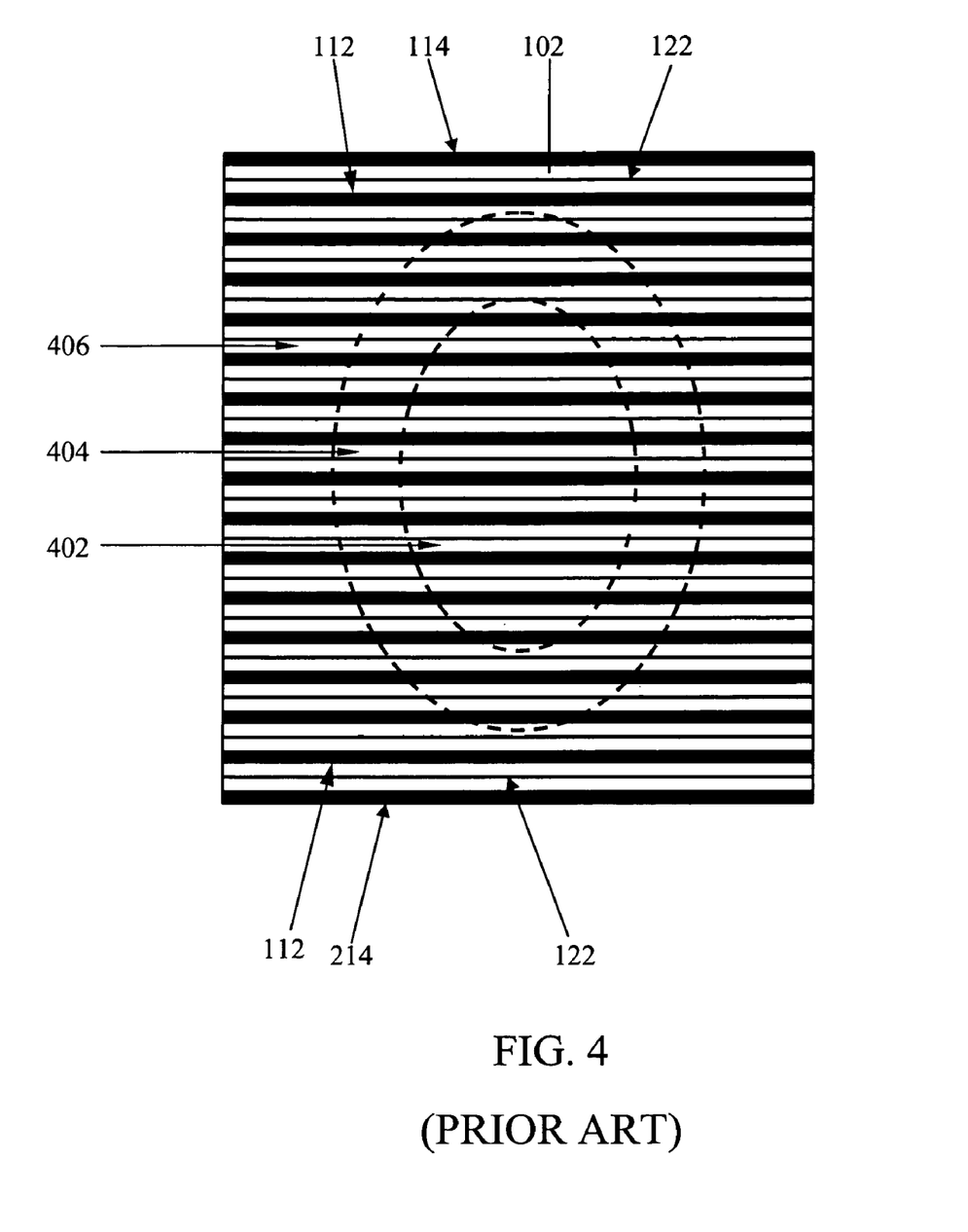
FIG. 4 is a plan view of a photovoltaic wafer illustrating the solder non-uniformity, in accordance with the first preferred embodiment of the present invention.

As illustrated in the plan view of the die 200 in FIG. 4, the curvature of the die 200 surface during solder reflow may give to a first region 402 within which there is extensive and uniform electrical bonding between the die 200 and substrate 390. Outside the first region is a second region 404 in which electrical contact between the die 200 and substrate 390 is achieved but the sold bonds form discrete pillars instead of a sheet of uniformly distributed solder. Outside the second region 404 is a third region 406 in which there is little or no solder bonding between the die 200 and substrate 390, thus giving rise to a product defect and lower yields. Note that the boundaries between the regions 402, 404, 406 are generally elliptical due to the elongated character of the cross bars 112, 122. That is, the continuous lengths of metallization of the cross bars 112, 122 produces greater expansion, thus greater curvature, in the horizontal direction while the discontinuous conductive traces in the vertical direction produce less expansion, thus less curvature.

In addition to problems bonding large dies to substrate, the dies cut from wafers generally possess conductive layers of metallization that fail to make the most efficient use of surface area. In particular, a die generally has two side edge cross bars 114 at the extreme edges of the die that have the same width (vertical dimension) as the intermediate cross bars 112. Since the side edge cross bars 114 are adjacent to a single n-type cross bar 122, the side edge cross bars collect electrons from approximately half the area of the intermediate cross bars 112. As such, the width of the side edge cross bars 114 may be unduly large in view of the current collection and thereby degrade the overall collection efficiency of the die 200.

There is therefore a need for a system and method of generating uniform solder bonds wafers or relatively large die and underlying substrate without reducing the production yields. There is also a need for a photovoltaic wafer that minimizes the surface area of the conductive traces and maximizes the overall efficiency of the wafer.

SUMMARY

The invention in one embodiment features a substrate having a first layer characterized by a first coefficient of thermal expansion (CTE), and a second layer characterized by a second CTE different than the first CTE, and a layer of solder adapted to bond the first layer to one or more semiconductor dies. The term die encompasses semiconductor wafers, chips, and cells. The substrate, which is adapted to curl when subjected to an elevated temperature, assumes a curvature that substantially matches the curvature of the one or more dies at the reflow temperature of the solder, thereby creating a uniform gap between the one or more dies and substrate across the bond there between when the solder solidifies.

The invention in another embodiment employs a solder paste deposition pattern that includes a plurality of beads, the volume of the beads being based on the magnitude of the gap between the die and substrate when the subjected to an elevated temperature in a solder reflow oven, for example. Relative large solder beads may be deposited around the region corresponding to the periphery of the die to compensate for the relatively large gap that arises as the outer edges of a die pull away from the substrate when heated.

BRIEF DESCRIPTION OF THE DRAWINGS

The present invention is illustrated by way of example and not limitation in the figures of the accompanying drawings, and in which.

DETAILED DESCRIPTION OF THE PREFERRED EMBODIMENT

Figure 5:
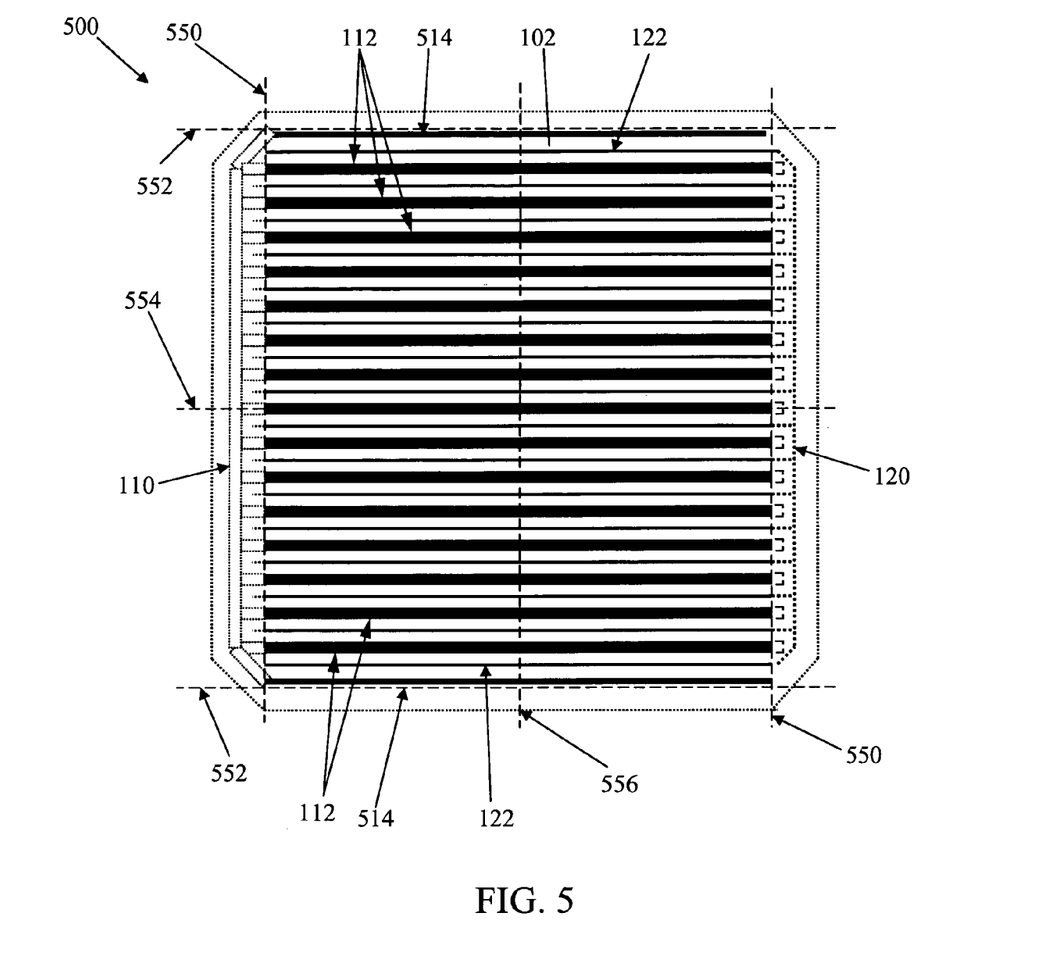
FIG. 5 is a plan view of a photovoltaic wafer including semiconductor members, in accordance with the prior art.

Illustrated in FIG. 5 is a plan view of a silicon wafer including semiconductor members, in accordance with a first preferred embodiment of the present invention. The wafer 500 is preferably a silicon photovoltaic cell wafer although a wide variety of other types of semiconductor chips, and semiconductor devices more generally, may be bonded to circuit boards or heat sinks using the present invention. For example, the present invention may be used to bond a central processing (CPU) such as a PENTIUM (TRADEMARK) chip from Intel Corporation of Santa Clara, Calif. without the need of a processing step for applying what are referred to by those skilled in the art as solder "bumps" to the chip bonding pads. Thus, the present invention in some embodiments offers a "bumpless" manufacturing and bonding attachment system and method.

The wafer 500 is adapted to transform sunlight into electrical energy using a p-n junction incorporated into the same side of the wafer, i.e., the side opposite the solar exposure. Like the prior art wafer 100, the p-n junction includes a p-type semiconductor, n-type semiconductor, and associated conductive layers applied to or incorporated into the wafer 500. The p-type semiconductor of the novel wafer 500 includes a first set of cross bars including one or more intermediate cross bars 112. The novel wafer 200 also includes a second set of cross bars 122 including n-type cross bars interdigitated with the first set of p-type cross bars 112.

In contrast to the prior art wafer 100, the wafer 500 preferably does not employ the first edge bar 110 and a second edge bar 120. The conductive capacity of an underlying substrate discussed in more detail below obviates the need for interconnection bars also known as ohmic bars by those skilled in the art. The absence of the first edge bar 110 and a second bar 120, which contribute relatively little to the overall current collection capacity of the wafer 100, may therefore be removed from the wafer 500 and thereby increase the collection efficiency per unit area of the wafer. In the preferred embodiment, the wafer 500 is produced by cutting off the left and right edges of the wafer 100 along the left and right cut lines 550, although one skilled in the art will appreciate that the wafer may also be manufactured without the first edge bar 110 and second bar 120.

The collection efficiency of the novel wafer 200 may be further improved using two partial-width cross bars 514 at the side edges, each of which is narrower than the thickness of one or more of the associated intermediate cross bars 112 between the pair of partial-width cross bars 514. The width of each of the partial-width cross bars 514 is approximately half the width of the intermediate cross bars 112. The width (in vertical direction perpendicular to longitudinal axis of cross bar) of the partial-width cross bars 514 is substantially equivalent to the width of the effective hole collection area of an intermediate cross bar 112 on the side of the adjacent n-type cross bar 122 opposite the partial-width cross bar 514. As described above, the gap between each of the p-type partial-width cross bars 514 and an adjacent n-type cross bar 112 is preferably substantially the same as the gap between each of the p-type intermediate cross bars 112 and an adjacent n-type cross bar. The length of the partial-width cross bars 514 may be equal to or less than that of the intermediate cross bars 112 where the silicon wafer has been trimmed to have the shape of a square, for example, although the shape of various other polygons may be employed.

The two partial-width cross bars 514 at the side edges are produced, in the preferred embodiment, by cutting off the upper and lower edges of the wafer 100 as indicated by upper and lower cut lines 552 and then preferably polishing the edges. As described in more detail below, a plurality of relatively small photovoltaic chips or dies may be created by partitioning and cutting the wafer 500, which has a diameter approximately equal to that of the semiconductor ingot. The cuts used to produce the smaller photovoltaic chips are schematically illustrated by one or more horizontal cut lines 554 and one or more vertical cut lines 556. In the preferred embodiment, each of the horizontal cuts 254 made parallel to the intermediate cross bars 112 bisects an intermediate cross bar 112 in order to produce a new partial-width cross bar that matches the original partial-width cross bar 514 of the wafer.

In the example illustrated, the dimensions of the photovoltaic chip after cutting are approximately 15 by 22 millimeters, although this is subject to the maximum curvature of a chip subjected to the heat of a solder reflow oven and the ability of the solder to flow upward between the curved chip and substrate. The curvature depends on the temperature as well as the thickness and coverage of the metallization incorporated into the wafer 500.

Figure 6:
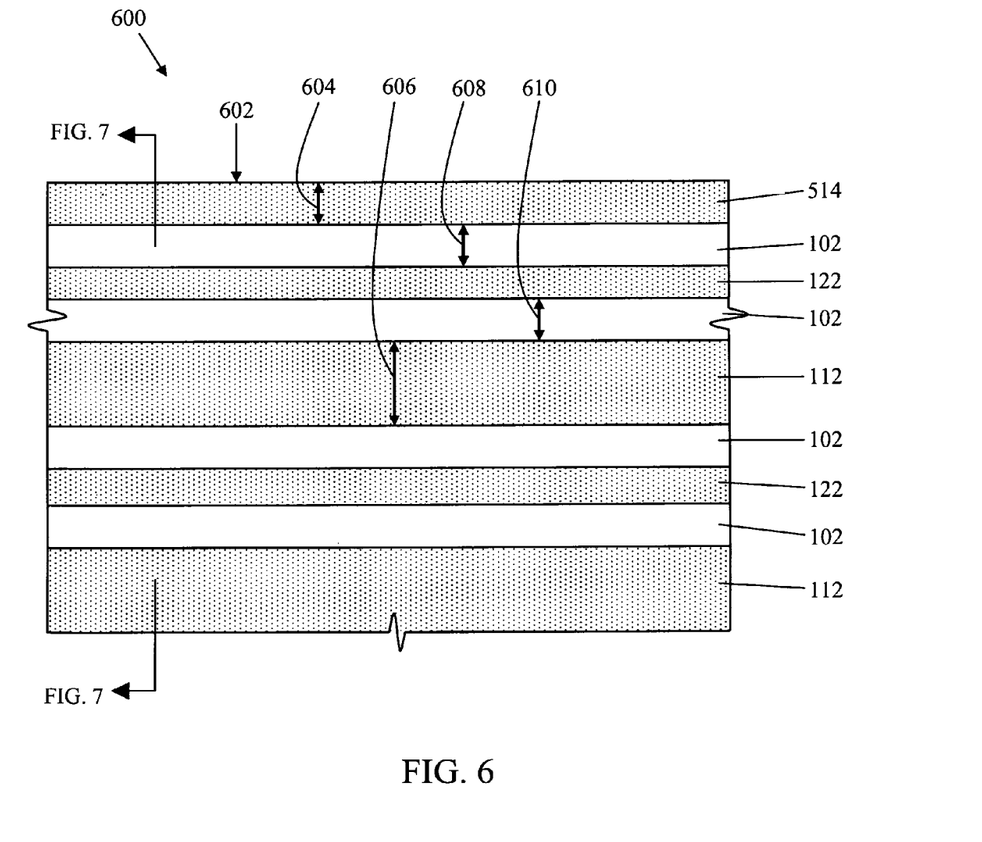
FIG. 6 is a schematic illustration of the photovoltaic die in plan view, in accordance with the first preferred embodiment of the present invention.
Figure 7:
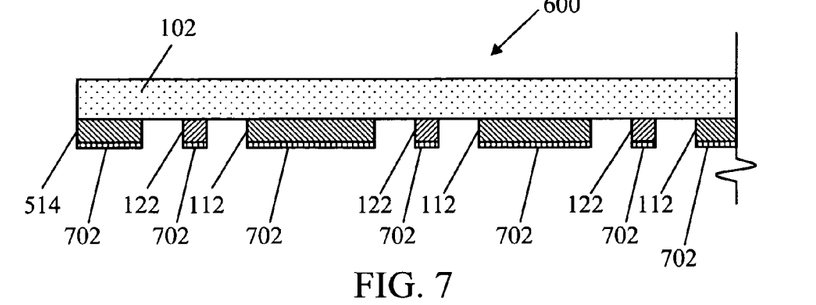
FIG. 7 is an edge-on view of the photovoltaic die, in accordance with the first preferred embodiment of the present invention.

Illustrated in FIG. 6 and FIG. 7 are schematic illustrations of one of the plurality of photovoltaic dies produced from the wafer 500 in plan view and edge-on view, respectively. FIG. 6 and FIG. 7 illustrate the p-type and n-type semiconductors and associated conductive traces in the upper most edge 602 of the die 600 including a novel partial-width cross bar 514. The silicon substrate 102, a plurality of intermediate cross bars 112, and the n-type cross bars 122 are also shown. As can be seen, the width 604 of the partial-width cross bar 514 is substantially equal to one-half the width 606 of each of the intermediate cross bars 112 associated with the p-type semiconductor. The reduced size of the partial-width cross bar 514 eliminates the excess conductor and p-type material present in the prior art that may reduce the overall collection area or collection efficiency of the die 600. In the preferred embodiment, the first gap 608 between the partial-width cross bar 514 and adjacent n-type cross bar 122 is substantially equal to the second gap 610 between the opposing intermediate cross bar 112 and same adjacent n-type cross bar 122.

In the preferred embodiment, the width 606 of the p-type intermediate cross bars 112 is approximately 60 mils, the width of the n-type cross bars 122 is approximately 16 mils, and the gaps 608, 610 there between are approximately 8 mils.

As illustrated in the edge-on view of the die 600 in FIG. 7, the die comprises a silicon substrate 102 and a plurality of semiconductor layers and associated conductive traces 112, 514, 214. A protective layer of tin 702 may be applied to or incorporated into conductive traces 112, 122, 514 to conceal the underlying layers and inhibit oxidation.

Figure 8:
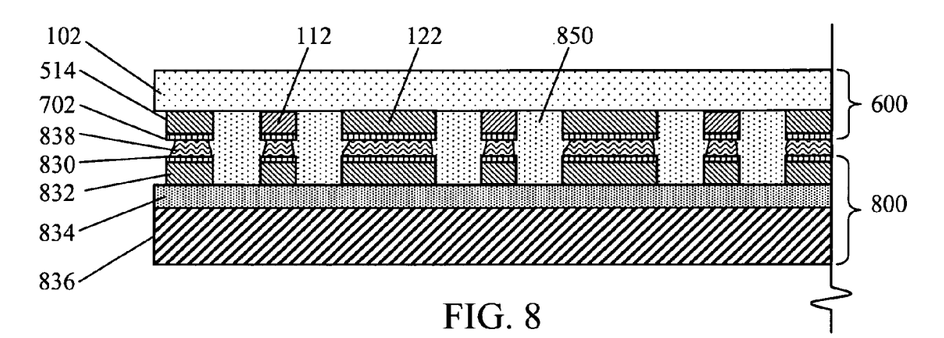
FIG. 8 is an edge-on view of the photovoltaic wafer bonded to a complementary substrate, in accordance with the first preferred embodiment of the present invention.

Illustrated in FIG. 8 is an edge-on view of the photovoltaic die bonded to a second substrate 800 that compliments the silicon substrate 102. Like prior art substrates, the substrate 800 provides structural support and thermal dissipation for the die 600. In addition, the substrate 800 in the first preferred embodiment also provides electrical conductivity to augment the limited conductivity of the first set of conductive traces of the die 600, thereby minimizing the resistive losses—referred to as $i^2R$ losses—of the p-type and n-type semiconductors and corresponding conductive layers. The portion of the substrate 800 that provide electrical conductivity to the plurality of cross bars and in some cases between cells is referred to herein as a laminated power circuit. The laminated power circuit includes the first set of conductive traces associated with the die 600, a second set of conductive traces incorporated into the substrate 800, and the solder there between. The first set of conductive traces is incorporated into the die and includes the first plurality of cross bars 112, 514 and second set of cross bars 122. The second set of conductive traces incorporated into the substrate 800 mirror the first set of conductive traces across substantially the entire die 600, i.e., the first plurality of cross bars 112, 514 and second set of cross bars 122. The power circuit in some embodiments further includes conductive traces that electrically interconnect each of the cross bars of the semiconductor type to one another, for both the p-type and n-type semiconductors. The power circuit may further include conductive traces that electrically interconnect the particular die to one or more additional dies in a photovoltaic cell array (not shown).

In the first preferred embodiment, the second set of conductive traces of the power circuit comprises one or more metallic layers, e.g., etched copper 832, coupled to a rigid layer 836 including aluminum, for example, for thermal conductivity. The one or more metallic layers may further include a protective layer of tin 830 applied to the etched copper traces 832 through an electrolysis process in order to inhibit oxidation of the copper 832 and enhance solderability. Prior to etching the copper trace 832, the layer of copper is thermally bonded to the aluminum 836 using an intermediate layer 834 that is elastomeric, thermally conductive, and electrically insulative. The intermediate layer 834 is adapted to electrically isolate the different conductive layers, which have a potential difference of approximately 3 volts. In some embodiments, the intermediate layer 834 is adapted to withstand a standoff voltage of 2200 volts between the die 600 and the rigid member 836, which is needed to comply with Underwriters Laboratory requirements. The substrate 800 is subsequently bonded to the die 600 using solder 838 applied with a stencil and reflowed in a solder reflow oven, for example.

The intermediate layer 834 in the preferred embodiment is ARLON available from Circuit Tree of Arcadia, Calif. In the preferred embodiment, the conductive layer of copper is 8 mils thick, the intermediate layer 834 of ARLON is approximately 5 mils thick, and the rigid member 836 of aluminum is approximately 187.5 mils thick.

In this and other embodiments, the assembly of the substrate and die further includes an under-fill, preferably a flip chip under-fill 850 well known to those skilled in the art, to prevent the ingress of water of other harmful contaminant in the cavities between the patterned conductors etched from the first layer 832.

Figure 9A:
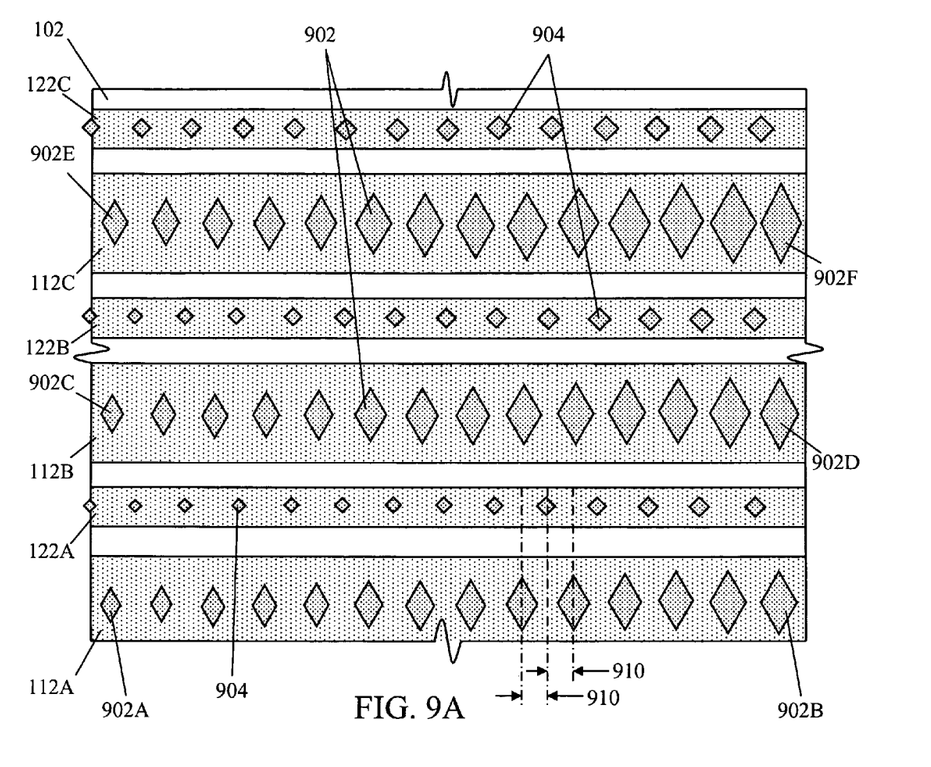
FIG. 9A is a plan view of the photovoltaic wafer and solder print for bonding the wafer to a complementary substrate, in accordance with a second preferred embodiment of the present invention.

Some embodiments of the present invention employ a non-uniform solder paste pattern to overcome solder bonding degradation that may result when the edges of a die curl away from a substrate when subjected to the heat of a solder reflow over. Illustrated in FIG. 9A is a plan view of the photovoltaic die and pre-reflow solder paste pattern for bonding the die 600 to a complementary second substrate, in accordance with a second preferred embodiment of the present invention. The distribution of solder paste in this embodiment improves the electrical bonding between the die 600 and substrate 800 in comparison to the prior art technique discussed above in context of FIG. 2. Electrical bonding, including the number and uniformity of solder bonds, is improved by varying the quantity of solder paste deposited across the die 600 as a function of the curvature of the die at the solder melting temperature or resolidification temperature. In particular, this embodiment of the invention utilizes less solder paste per unit area of conductor in proximity to the center of the die 600 and more solder paste per unit area of conductor at the periphery of the die where it pulls away from the substrate when subjected to solder reflow.

Assuming the region of the photovoltaic die 600 in FIG. 9A (or wafer 500 in FIG. 5) corresponds to the upper right quadrant of the die, the lower left of the section of the photovoltaic die 600 in FIG. 9A is proximal to the center of the die while the upper right point is relatively further away from the center. To compensate for the curvature of the die 600, a smaller volume of solder paste (per unit area of cross bar) is deposited in the lower left than that deposited in the region toward the top of the illustration as well as region to the right. For example, the volume of the solder beads 902A, 902C, 902E associated with the p-type semiconductors 112A, 112B, 112C increase from bottom to top. The volume of the solder beads 902A-902B associated with the p-type semiconductor 112A also increase from left to right. Similarly, the solder beads 902C-902D associated with the p-type semiconductor 112B and the solder beads 902E-902F associated with the p-type semiconductor 112C increase in volume from left to right. The solder beads applied to the n-type semiconductor 122A, 122B, 122C are also varied in an analogous manner to compensate for the curvature, i.e., the curl, of the die 600 in the solder reflow oven.

If the solder paste is applied by stencil, the thickness of the solder beads 902A-902F is constant and equal to the thickness of the stencil. The area of the beads of solder paste, in plan view, is then varied to change the solder volume of each bead deposited. The requisite volume of solder paste at a point on the die may be estimated by determining the nominal area of distribution of the solder after reflow and the distance d between the die 600 and substrate 800. An analogous solder volume determination is made for the solder paste beads applied to the die 600 in proximity to the n-type semiconductors.

In the preferred embodiment, the individual beads of solder paste are applied at uniform increments—twice the distance represented by 910—in a single array for each of the plurality of edge bars and cross bars. The array of solder paste beads applied to the p-type semiconductor is stagard or otherwise offset with respect to the array of solder past beads by an offset distance 910 to reduce the probability of solder bridging the gap between adjacent semiconductors, thus shorting out the die 600.

In the second preferred embodiment, the individual solder paste beads have the shape of diamonds to increase the probability of adjacent beads of a common conductor reflowing together to form a continuous layer of solder and reduce the probability of forming air pockets. The diamond shaped stencil pattern also reduces the probability that solder beads of one cross bar do flow together with the nearest beads of an adjacent cross bar associated with a different semiconductor, which would create a short circuit. In some embodiments, the aspect ratio of these diamonds in varied in order to minimize the gap between adjacent solder beads. The smaller solder beads in proximity to bead 902A, for example, may be made shorter and wider than the beads in proximity to bead 902F in order to minimize the distance between adjacent solder beads, thereby enhancing the ability of the solder beads to flow together once the reflow temperature has been reached. In some embodiments, the aspect ratio of the solder beads 902A-902F may be varied in order to make the gap between the adjacent beads equi-distance for all beads on the intermediate cross bars 112 and partial-width cross bars 514. The solder beads applied to the n-type semiconductors are also varied in an analogous manner to compensate for the curvature, i.e., the curl, of the die 600.

Figure 9B:
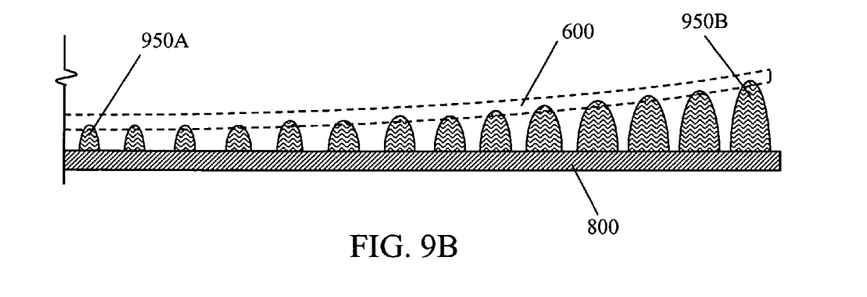
FIG. 9B is a cross sectional view of a substrate showing reflowed solder in the absence of a die, in accordance with a preferred embodiment of the present invention.

Illustrated in the cross-sectional view of the second substrate in FIG. 9B are solder beads 950A-950B subjected to a reflow oven in the absence of a die (shown in dashed lines). As can be seen, the surface tension of the solder draws the beads into droplets 950A-950B, each of which has a height that exceeds the gap at that position between the substrate and a die with heat-induced curl at the solder resolidification temperature. As one skilled in the art will appreciate, all solder beads are therefore adapted to contact and bond with the under side of a die across the entire surface of the die regardless of the curl. The surface tension of the solder also causes the solder beads to flow together to create a continuous solder bond between each conductor and the complimentary trace on the second substrate 800, thereby creating uniform electrical and thermal contact across the substrate. In the preferred embodiment, the gap between the die 600 and substrate 800 is held to less than 4 mils, which can be bridged by solder across a die of approximately 18 millimeters in a direction perpendicular to the cross bars 112, 514, 122, although the distance over which the same 4 mil gap can be held in the direction parallel to the cross bars is generally less (approximately 15 mm) due to the increased curling in that direction.

Figure 10:
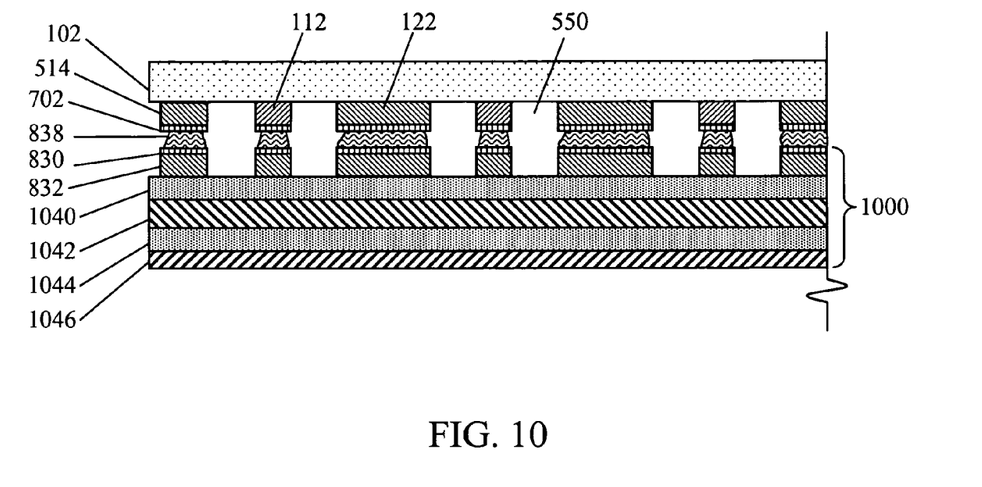
FIG. 10 is an edge-on view of the photovoltaic wafer bonded to a complementary substrate, in accordance with a third preferred embodiment of the present invention.

Illustrated in FIG. 10 is a sectional view of the photovoltaic die bonded to a complementary second substrate in accordance with a third preferred embodiment of the present invention. The invention in the third embodiment includes a third substrate 1000 that provides structural support for the die 600 while dissipating thermal energy received there from. Like the second substrate 800 described above, the third substrate 1000 also provides enhanced electrical conductivity to the embedded cross bars 112, 514, 122 of the die 600 and electrical coupling between the first set of traces 112, 514 and between the second set of traces 122. The conductive traces of the die 600 together with cross bars embedded in the substrate and solder there between cooperate to form a laminated power circuit (for internally collecting current within the die or solar panel) that substantially reduces resistive losses compared to prior art photovoltaic cells.

The first set of conductive structures embodied in the die 600 include the p-type semiconductors, the n-type semiconductors, and the associated conductive cross bars coinciding with the p-type and n-type semiconductors. The conductive traces incorporated into the substrate 1000 are metallic traces, preferably copper with a protective layer of tin, mirror the cross bars incorporated in the die 600 across substantially the entire die.

In the third preferred embodiment, the third substrate 1000 comprises a plurality of layers or plies selected such that the entire substrate is adapted to achieve a predetermined curvature when subjected to heat. In some implementations of this embodiment, the composition and thickness of the plurality of layers is selected such that the curvature of the substrate 1000 precisely matches the curvature induced in the die 600 at the solder reflow temperature, thereby minimizing the gap between the die and substrate and maximizing the electrical bonding there between. In some other implementations of this embodiment, the curvature is substantially zero to prevent bending of the die 600 and substrate 1000 assembly when deployed and subject to environmental thermal cycles. In still another implementation discussed below, the materials and their associated thicknesses are such that the curvature at a predetermined operating temperature, for example, induce a pressure differential between the substrate 1000 and a heat sink to enhance the thermal conductivity there between.

In the fourth preferred embodiment, the plurality of plies incorporated into the substrate 1000 include at least five layers, although one skilled in the art may use more or less layers depending on the application. The first layer 832, preferably copper, is an electrically conductive and thermally conductive layer directly or indirectly bonded to the die 600. The first layer, which may be protectively concealed with a layer of tin, for example, serves to augment the current carrying capacity of the first set of conductive layers 110, 112, 514, 120, 122 of the die 600 while dissipating energy through a heat sink (introduced below).

The second layer 1040 and fourth layer 1044 are thermal laminates selected for their thermally conductive, and electrically insulative properties. In the third preferred embodiment, the second layer 1040 and fourth layer 1044 are thermal laminates with pre-cured epoxy or thermal pre-cured epoxy distributed under the brand name are T-LAM or T-PREG, respectively, which are available from Thermagon of Cleveland, Ohio or an affiliated manufacturer. For purposes of producing computer chips, the second layer 1040 and fourth layer 1044 may include or otherwise employ FR4 epoxy.

The third layer 1042 is preferably STABLCOR, which is available through Thermal Works of Huntington Beach, Calif., although other materials may also be used including INVAR which is a metal alloy with a very low coefficient of thermal expansion. INVAR consists essentially of steel with 36% nickel. The fifth layer 1046 is a substantially rigid, thermally conductive material such as aluminum, although various other metal and non-metal layers thermal conductors may also be employed.

In order to thermally induce an upward curvature in the substrate 1000 corresponding to the die 600, the plurality of plies are selected based upon their CTE and thickness so as to cause the lower surface of the substrate to expand at a greater rate than the upper surface in proximity of the die 600. The third layer 1042 is selected to have a CTE less than the fifth layer 1046. The CTE of preferably STABLCOR is approximately −1.5 parts per million (ppm) per degree Celsius (C), the CTE of aluminum is approximately 24 ppm/degree C., and the CTE of copper is approximately 18 ppm/degree C. Together the third layer 1042 and fifth layer 1046 induce a flexure in the first layer 832 of copper, which forces the peripheral edges of the substrate 1000 to curl upward relative to the central region of the substrate.

In contrast to above, in order to prevent curvature in the die 600 and substrate 1000 assembly, the thickness of the fifth layer 1046 may be selected to precisely match and thus counteract the thermal expansion of the first layer 832, although one skilled in the art will recognize that selection of various other materials and thicknesses may also be used to substantially eliminate curvature in substrate 1000.

In some embodiments, one or more plies of the plurality of plies 1000 are heterogeneous in order to alter the thermal conductive properties or structural properties. A pattern of holes, for example, may be drilled into the third layer 1042 prior to assembly of the substrate 1000 and the holes (perpendicular to the substrated) filled with one or more thermally conductive materials to increase the thermal conductivity of the layer 1042. Although the presence of holes may reduce the effective CTE of the layer, appropriate modification may be made to the thickness of the third or other layer to induce the desired curvature. The frequency of the holes may differ with respect to the width and length of the substrate 1000 to impart a predetermined that matches the asymmetric curvature in the die 600 discussed above.

Figure 11:
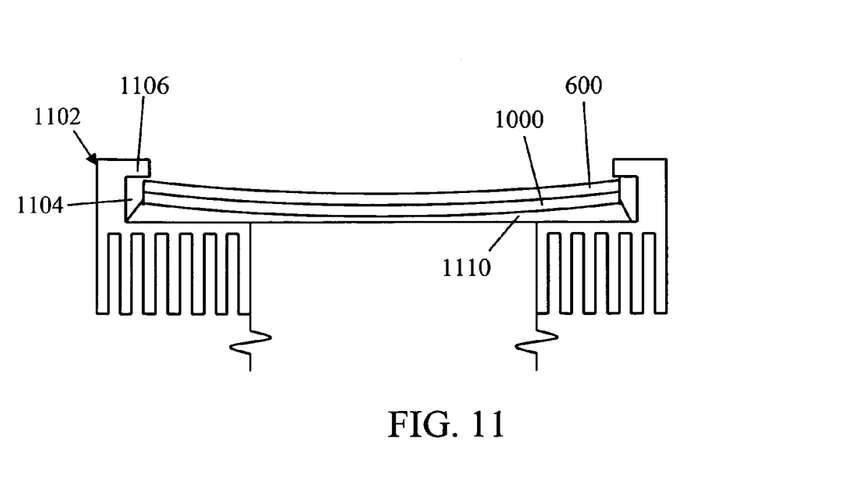
FIG. 11 is a side view of a heat sink adapted to receive a wafer and substrate, in accordance with a forth preferred embodiment of the present invention.

Illustrated in FIG. 11 is a side view of a heat sink adapted to receive a die and substrate, in accordance with a fourth embodiment. The combination of die 600 and first substrate 800 or second substrate 1000, for example, may be bonded to the heat sink 1102 using elastomeric, thermally conductive material such as a phase changer thermal compound. Some phase changer thermal compounds well known to those skilled in the art are pressure sensitive and have optimum thermal conductive properties when subjected to elevated pressure. This increased pressure may be achieved by securing a die 600 and substrate 1000 having a predetermined curvature within a heatsink in a manner that allows in the curvature to bias at least a portion of the substrate onto the heatsink.

In the third preferred embodiment discussed above, the composition and thickness of the plurality of plies of the substrate 1000 are selected to induce a curvature in the first ply 832 that is substantially equal to the curvature of the die 600 to which it is bonded at the solder 834 reflow temperature. In a fourth embodiment, however, the second substrate 1000 is adapted to express a predetermined concave curvature at the anticipated operating temperature of the die 600 sufficient to cause the combination of die and substrate 1000 captive in the heat sink cavity 1104 to apply the optimum pressure for a layer of thermal compound 1110 there between. If the operating temperature is anticipated to be 90 degrees C., for example, the substrate 1000 in the fourth embodiment is adapted to engage the heat sink tabs 1106 and flex the substrate and die sufficient to apply a target pressure of approximately 40 pounds per square inch (psi) across the central region of the phase changer thermal compound 1110. One skilled in the art will appreciate that the region of the induced pressure is dependent on various factors including the overall width of the substrate 1000 and the depth of the heat sink cavity 1104, which have been exaggerated in FIG. 11 for purposes of illustration.

As one skilled in the art will appreciate, phase change thermal compound is a liquid at the elevated operating temperatures of a photovoltaic sell when exposed to multiple sun levels of light, as is the case in a solar concentrator. The liquid layer therefore provides a slidable connection between the substrate 1000 and the heat sink 1102, thus allowing the assembly to absorb the relative movement of the components arising from the mismatch in thermal expansion.

In the fifth preferred embodiment not shown, the substrate 1000 of the fourth embodiment further includes alternating additional layers of electric conductor and thermal laminates interposed between the second layer 1040 and the third layer 1042. Like the second layer 1040, the intermediate layers of thermal laminate are thermally conductive and electrically insulative so as to isolate adjacent conductive layers. The resulting three pairs of electrical conductor and electrically insulators are then used to provide the laminated power circuits of a multi-die photovoltaic receiver. If the first layer 832 is patterned to match the conductive trace of a plurality of photovoltaic cells, the two underlying intermediate layers of electrical conductor may be patterned to electrically couple the plurality of cells in series, thus increasing the maximum voltage of the cell array. In particular, one of the two intermediate layers of electrical conductor may be used to couple the p-type semiconductor of a second cell to the n-type semiconductor of a first cell, while the second of the two intermediate layers of electrical conductor may be used to couple the n-type semiconductor of the second cells to the p-type semiconductor of a third cell. When repeated for successive cells, it is clear that the first of the two intermediate conductive layers couples the anode of every even numbered cell to a cathode of an adjacent odd numbered cell, while the second of the two intermediate conductive layers couples the cathode of every even numbered cell to the anode of an adjacent odd numbered cell. The interconnection of the dies' conductive paths termed vias, which are well know to those skilled in the art. As will be appreciated, the two intermediate conductive layers can have the width of a die and therefore provide the conductivity to substantially reduce the restive losses encountered with prior art cells. The two intermediate conductive layers are tantamount to power busses.

Where the dies are arrayed in an N×M array, where both N and M are greater than 2, adjacent busses may be separated so as to introduce conductive traces for bypass diodes that operatively couple cells so as to route around a plurality of intermediate cells.

Although the description above contains many specifications, these should not be construed as limiting the scope of the invention but as merely providing illustrations of some of the presently preferred embodiments of this invention.

Therefore, the invention has been disclosed by way of example and not limitation, and reference should be made to the following claims to determine the scope of the present invention.

I claim:

1. A method of bonding a plurality of semiconductor dies to a substrate, each of the dies susceptible to curling when subject to an elevated temperature; the method comprising the steps of:
    providing a semiconductor die having a center and a plurality of side edges;
    providing a substrate;
    applying to the substrate a layer of the solder paste; wherein the layer of solder paste comprises a plurality of beads, wherein the volume of each bead is selected based on the magnitude of a gap between the substrate and die at the point of application for a temperature substantially equal to the reflow temperature of the solder paste; wherein the volume of said beads increases from the center of the die to the plurality of side edges; and
    heating the substrate with solder paste and semiconductor die to the melting temperature of the solder paste to couple the die to the substrate;
    wherein the semiconductor die comprises an upper layer and a lower layer proximal to the substrate; wherein the semiconductor die curls above 160 degrees Celsius due to thermal expansion mismatch of the upper layer and lower layer.

2. The method of bonding in claim 1, wherein the semiconductor die is a photovoltaic cell.

3. A method of bonding a semiconductor die to a substrate, the die exhibiting curling due to coefficient of thermal expansion mismatch; the method comprising the steps of:
    applying a plurality of beads of a solder paste to either the substrate or semiconductor die, the plurality of beads comprising a first bead at a center of the semiconductor die and a second bead at an edge of the semiconductor die; wherein a volume of the second bead is greater than a volume of the first bead; wherein the plurality of beads further comprise a third bead interposed between the first bead and the second bead; wherein the volume of the third bead is greater than the volume of the first bead and less than the volume of the second bead;
    assembling the substrate and semiconductor die with the plurality of beads interposed between the semiconductor die and the substrate; and
    heating the substrate, beads of a solder paste, and semiconductor die to a solder reflow temperature of the solder paste to couple the die to the substrate.

4. The method of bonding in claim 3, wherein the semiconductor die is a photovoltaic cell.

* * * * *